United States Patent
Branson

(10) Patent No.: US 7,313,370 B2
(45) Date of Patent: *Dec. 25, 2007

(54) INTERMODULATION PRODUCT CANCELLATION IN COMMUNICATIONS

(75) Inventor: Roger Branson, Flower Mound, TX (US)

(73) Assignee: Nokia Siemens Networks Oy, Espoo (FI)

( * ) Notice: Subject to any disclaimer, the term of this patent is extended or adjusted under 35 U.S.C. 154(b) by 584 days.

This patent is subject to a terminal disclaimer.

(21) Appl. No.: 10/388,641

(22) Filed: Mar. 17, 2003

(65) Prior Publication Data

US 2004/0127183 A1    Jul. 1, 2004

Related U.S. Application Data

(63) Continuation-in-part of application No. 10/329,995, filed on Dec. 27, 2002.

(51) Int. Cl.
*H04B 1/04* (2006.01)

(52) U.S. Cl. ............... 455/114.2; 455/63.1; 455/67.13; 330/149

(58) Field of Classification Search ................ 455/205, 455/130, 108, 113, 114.2, 114.3, 295, 296, 455/125, 136, 137, 138, 142, 127.2, 63.1, 455/67.11, 67.13; 330/151, 149, 129, 52; 332/159; 341/118; 375/295, 296, 298
See application file for complete search history.

(56) References Cited

U.S. PATENT DOCUMENTS

| | | | |
|---|---|---|---|
| 3,900,823 A | 8/1975 | Sokal et al. | |
| 4,383,334 A | 5/1983 | Epsom | |
| 4,394,624 A | 7/1983 | Bauman | |
| 4,943,783 A | 7/1990 | Nojima | |
| 5,237,332 A * | 8/1993 | Estrick et al. | 455/205 |
| 5,455,538 A | 10/1995 | Kobayashi et al. | |
| 5,570,063 A | 10/1996 | Eisenberg | |
| 5,589,797 A | 12/1996 | Gans et al. | |
| 5,917,375 A * | 6/1999 | Lisco et al. | 330/149 |
| 6,087,898 A | 7/2000 | Baskin | |
| 6,104,241 A | 8/2000 | Cova et al. | |
| 6,154,093 A | 11/2000 | Chen et al. | |
| 6,163,213 A * | 12/2000 | Vaktnas | 330/149 |
| 6,363,120 B1 | 3/2002 | Myer et al. | |
| 6,393,011 B1 * | 5/2002 | Kim | 455/296 |
| 6,407,635 B2 * | 6/2002 | Mucenieks et al. | 330/149 |
| 6,437,644 B1 | 8/2002 | Kennington | |
| 6,504,428 B2 * | 1/2003 | Cova et al. | 330/149 |
| 6,853,248 B2 * | 2/2005 | Weldon | 330/149 |
| 6,958,647 B2 * | 10/2005 | Rabinovich et al. | 330/151 |
| 2003/0064738 A1 * | 4/2003 | Posner et al. | 455/136 |
| 2004/0125885 A1 * | 7/2004 | Branson | 375/295 |
| 2005/0264352 A1 | 12/2005 | Ichitsubo et al. | |

FOREIGN PATENT DOCUMENTS

EP    0966095    12/1999
WO    WO 02052717    7/2002

* cited by examiner

*Primary Examiner*—Quochien B. Vuong
(74) *Attorney, Agent, or Firm*—Lackenbach Siegel, LLP; Robert M. Bauer, Esq.

(57) ABSTRACT

Intermodulation products in the amplifier circuitry of a communications device are cancelled. A primary carrier is processed in a first main branch of amplifier circuit. The primary carrier is coupled to a secondary branch through a first signal splitters. Intermodulation products are created from a portion of the primary carrier coupled through the secondary branch. The intermodulation products are then coupled back into the main branch to produce an output signal provided to a transmitter.

22 Claims, 8 Drawing Sheets

NOMINAL AMPLIFIER

IM3 CANCELLATION

FIG. 7

| RF freq | IMamp_vs_Freq..OIP3_1 | IMamp_vs_Freq..OIP3_2 |
|---|---|---|
| 1.800E9 | 50.534 | 50.598 |
| 1.805E9 | 50.758 | 50.826 |
| 1.810E9 | 50.988 | 51.060 |
| 1.815E9 | 51.225 | 51.303 |
| 1.820E9 | 51.471 | 51.554 |
| 1.825E9 | 51.728 | 51.817 |
| 1.830E9 | 51.996 | 52.092 |
| 1.835E9 | 52.278 | 52.382 |
| 1.840E9 | 52.577 | 52.690 |
| 1.845E9 | 52.895 | 53.020 |
| 1.850E9 | 53.237 | 53.375 |
| 1.855E9 | 53.608 | 53.761 |
| 1.860E9 | 54.012 | 54.184 |
| 1.865E9 | 54.458 | 54.653 |
| 1.870E9 | 54.953 | 55.178 |
| 1.875E9 | 55.510 | 55.773 |
| 1.880E9 | 56.139 | 56.452 |
| 1.885E9 | 56.850 | 57.228 |
| 1.890E9 | 57.640 | 58.095 |
| 1.895E9 | 58.453 | 58.971 |
| 1.900E9 | 59.099 | 59.570 |
| 1.905E9 | 59.236 | 59.479 |
| 1.910E9 | 58.732 | 58.726 |
| 1.915E9 | 57.870 | 57.736 |
| 1.920E9 | 56.946 | 56.769 |
| 1.925E9 | 56.080 | 55.697 |
| 1.930E9 | 55.299 | 55.124 |
| 1.935E9 | 54.600 | 54.435 |
| 1.940E9 | 53.970 | 53.817 |
| 1.945E9 | 53.400 | 53.258 |
| 1.950E9 | 52.878 | 52.746 |
| 1.955E9 | 52.398 | 52.275 |
| 1.960E9 | 51.953 | 51.838 |
| 1.965E9 | 51.538 | 51.430 |
| 1.970E9 | 51.149 | 51.047 |
| 1.975E9 | 50.783 | 50.687 |
| 1.980E9 | 50.437 | 50.346 |
| 1.985E9 | 50.109 | 50.022 |
| 1.990E9 | 49.796 | 49.713 |
| 1.995E9 | 49.498 | 49.419 |
| 2.000E9 | 49.212 | 49.137 |

INTERMODULATION PRODUCT CANCELLATION IN COMMUNICATIONS

This application is a continuation-in-part of U.S. patent application Ser. No. 10/329,995 filed on Dec. 27, 2002, the contents of which is expressly incorporated by reference herein.

BACKGROUND OF THE INVENTION

1. Field of the Invention

The present invention relates generally to communications. More particularly, the present invention relates to amplifier circuitry used in communications systems.

2. Description of the Related Art

In communications, intermodulation products may be generated when processing fundamental frequencies through the amplifier circuitry of a transmission system. See FIG. 1. If not suppressed, then these intermodulation products can cause interference and distortion in the transmitted signal.

There are several existing methods of suppressing intermodulation products, such as filtering, reducing the operating efficiencies of the power amplifier, and feed-forward control systems. Each of these methods has disadvantages. Filtering in some systems, such as an EDGE modulation system, cannot easily remove third order intermodulation products (IM3) because IM3 products are very close to the primary carrier of the intended signal(s). Reducing operating efficiencies of the amplifier prevents growth of intermodulation products, but results in less amplification at a particular stage and generates more heat to be dissipated into the surrounding system.

FIG. 2 illustrates a prior art single loop feed-forward control circuit that uses a reverse diode configuration in the feedback path. The idea is to reproduce the portion of the signal clipped by the amplifier when operating at or near compression by using the reverse diode circuit. The replicated signal can then be reinserted back into the main path to pump up the primary carrier, which makes the intermodulation products look smaller. The feedback configuration will not work unless the amplifier is operating near compression. In other words, it has no effect on intermodulation products when the signal is backed away from compression. In addition, the configuration disadvantageously requires a delay line in the feedback path.

A dual loop feed-forward control circuit has a first loop which acts to null the primary carrier(s) by comparing a delayed version of the primary carrier(s) against a phase adjusted, amplified version of the primary carrier(s) having intermodulation components. See FIG. 3. The intermodulation products resulting from the comparison are delivered to the second loop. The amplitude and phase of those intermodulation products are adjusted and inserted back into the main path with a delayed version of the primary carrier in such a way as to suppress (cancel or reduce) the main amplifier's intermodulation products.

A dual loop feedback system may suppress intermodulation products, but the delay lines and multiple couplers required to align, sample and merge signals decreases the efficiency and significantly increases the size. The delay lines must be large if large bandwidths are required (>1 MHz). Efficiency of the circuit is important, but in next generation multicarrier systems, circuit size is also important.

BRIEF SUMMARY

It is an object of the following preferred embodiments to provide improvements in the ability of transmitter circuitry to suppress higher harmonic intermodulation products. The preferred embodiments use a relatively few number of elements without delay lines to permit the circuit to have reduced cost and size while providing optimum operation in a next generation multi-carrier cellular communication system.

In a first aspect, a preferred embodiment of the invention involves an amplifier circuit comprising a first branch; a second branch; a signal splitter, the signal splitter splitting an input signal having a primary carrier with fundamental frequencies into first and second signals which are provided, respectively, to the first branch and the second branch, the first branch amplifying said first signal from said signal splitter to obtain an amplified signal, the second branch multiplying said second signal to produce a signal containing higher order intermodulation products; and a coupler, the coupler combining the amplified signal from the first branch and the signal from the second branch containing higher order intermodulation products to produce an output signal.

In a second aspect, a preferred embodiment of the invention involves a base station in a wireless communication system, comprising: a transmitter, said transmitter communicating with at least one piece of user equipment; and an amplifier circuit, said amplifier circuit including: a first branch; a second branch; a signal splitter, the signal splitter splitting an input signal having a primary carrier with fundamental frequencies into first and second signals which are provided, respectively, to the first branch and the second branch, the first branch amplifying said first signal from said signal splitter to obtain an amplified signal, the second branch multiplying said second signal to produce a signal containing higher order intermodulation products; and a coupler, the coupler combining the amplified signal from the first branch and the signal from the second branch containing higher order intermodulation products to produce an output signal, said output signal being provided to said transmitter.

BRIEF DESCRIPTION OF THE DRAWINGS

The foregoing and a better understanding of the present invention will become apparent from the following detailed description of example embodiments and the claims when read in connection with the accompanying drawings, all forming a part of the disclosure of this invention. While the foregoing and following written and illustrated disclosure focuses on disclosing example embodiments of the invention, it should be clearly understood that the same is by way of illustration and example only and that the invention is not limited thereto.

FIG. 7 is a chart showing the results for the intermodulation product cancellation circuit as a function of frequency.

DETAILED DESCRIPTION OF THE PREFERRED EMBODIMENTS

Before beginning a detailed description of the preferred embodiments of the invention, the following statements are in order. The preferred embodiments of the invention are described with reference to a network element in an exemplary next generation multi-carrier cellular communication network. However, the preferred embodiments are not limited to a next generation multi-carrier cellular communication network. They may be practiced in any wireless communications system or in any wired communications system, such as a cable television system. The arrangement and embodiment of the exemplary cellular system is shown in block diagram form and described in this application without excessive detail in order to avoid obscuring the invention, and also in view of the fact that specifics with respect to implementation of such a system are known to those of ordinary skill in the art and may be dependent upon the circumstances. In other words, such specifics are variable but should be well within the purview of one skilled in the art. Where specific details are set forth in order to describe example embodiments of the invention, it should be apparent to one skilled in the art that the invention can be practiced without, or with variation of, these specific details.

Figure 1:
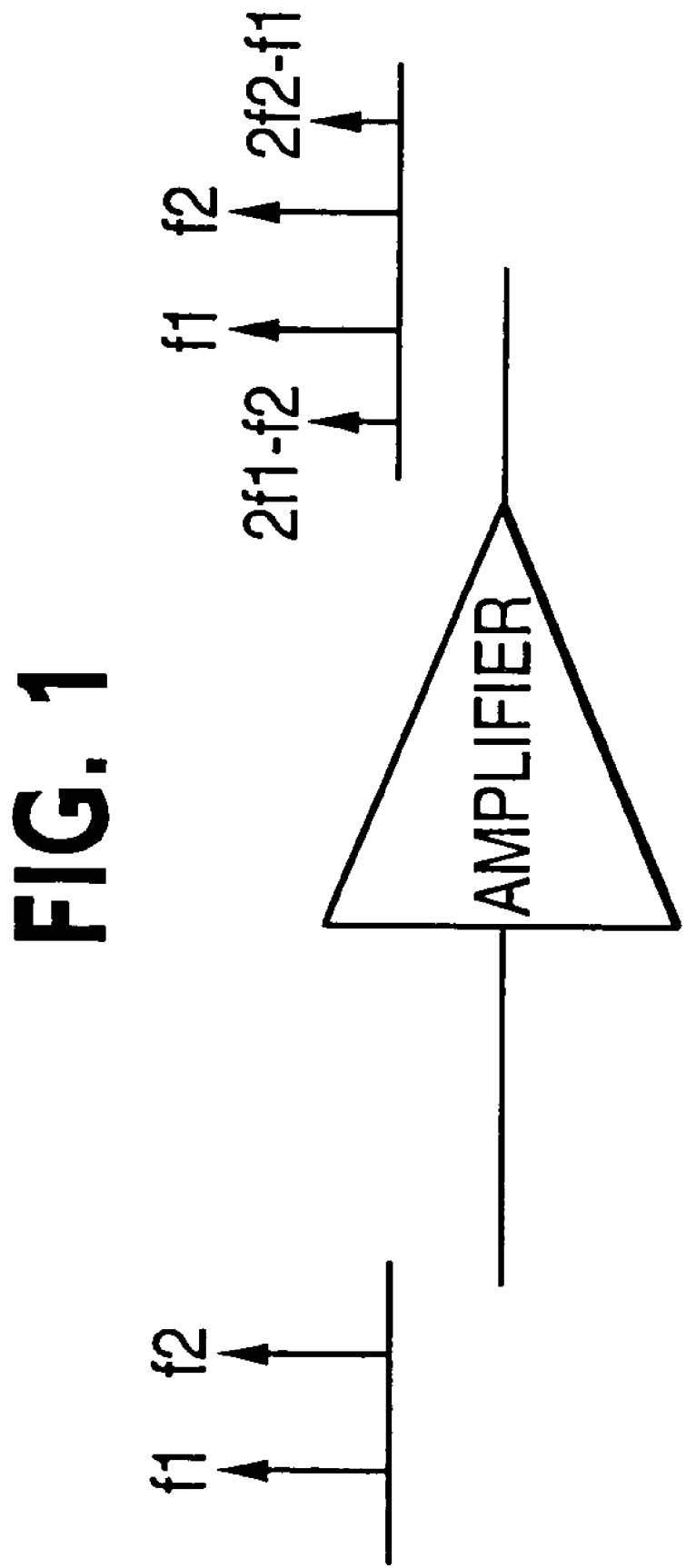
FIG. 1 is an illustration of amplifier intermodulation products.
Figure 2:
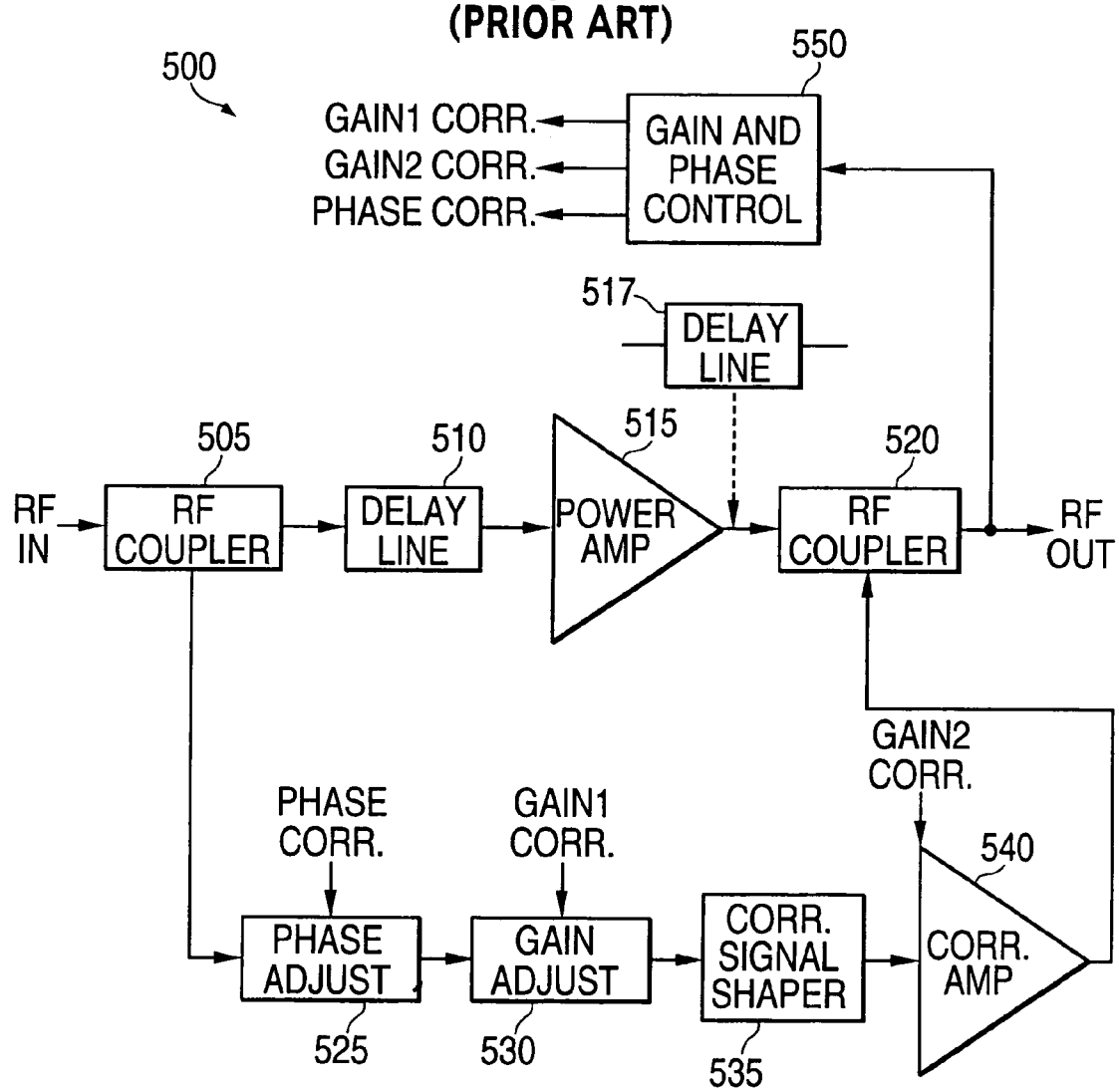
FIG. 2 illustrates a prior art single loop feed-forward control circuit for an amplifier.
Figure 3:
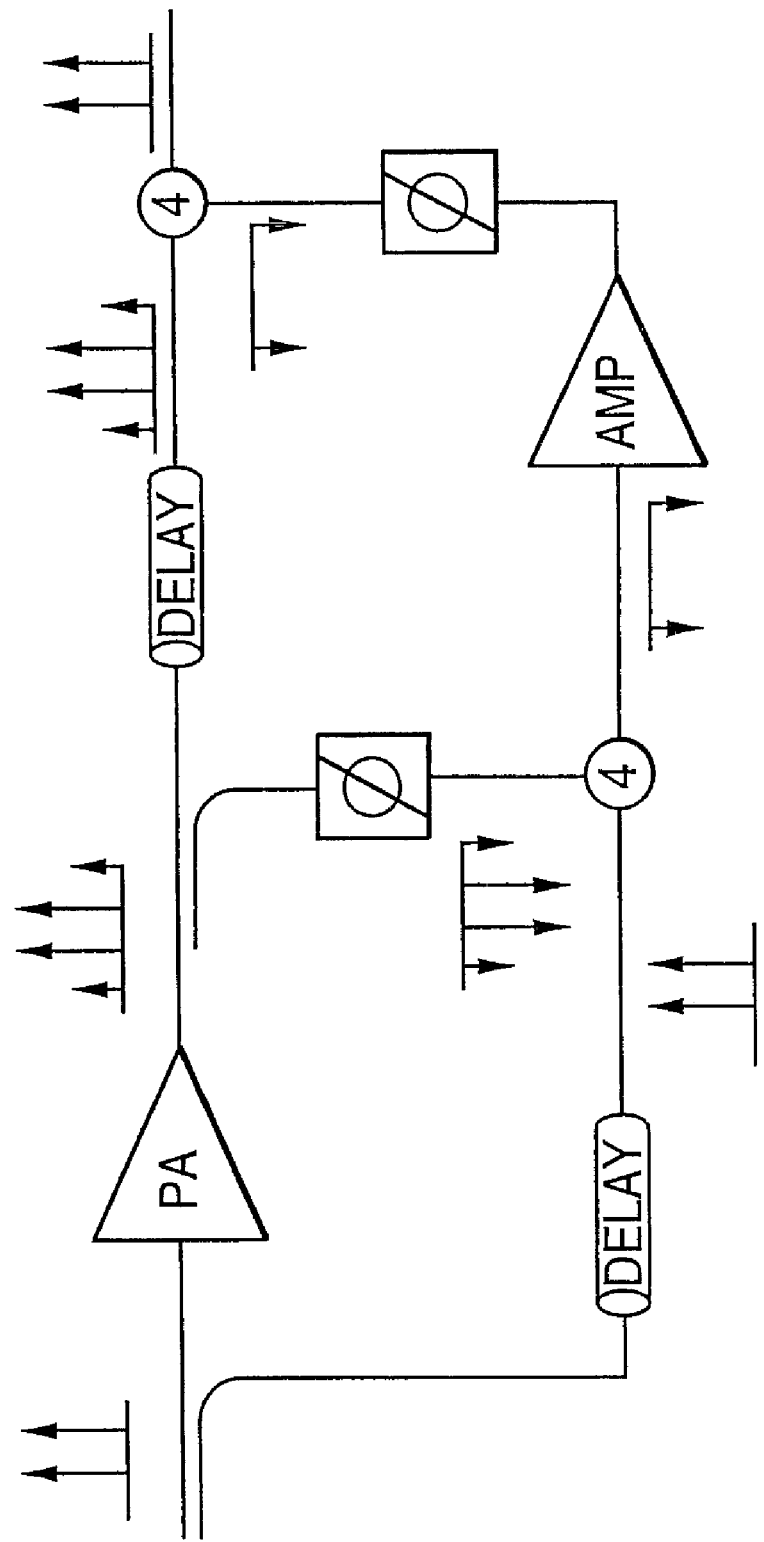
FIG. 3 illustrates a prior art double loop feed-forward control circuit for an amplifier.
Figure 4:
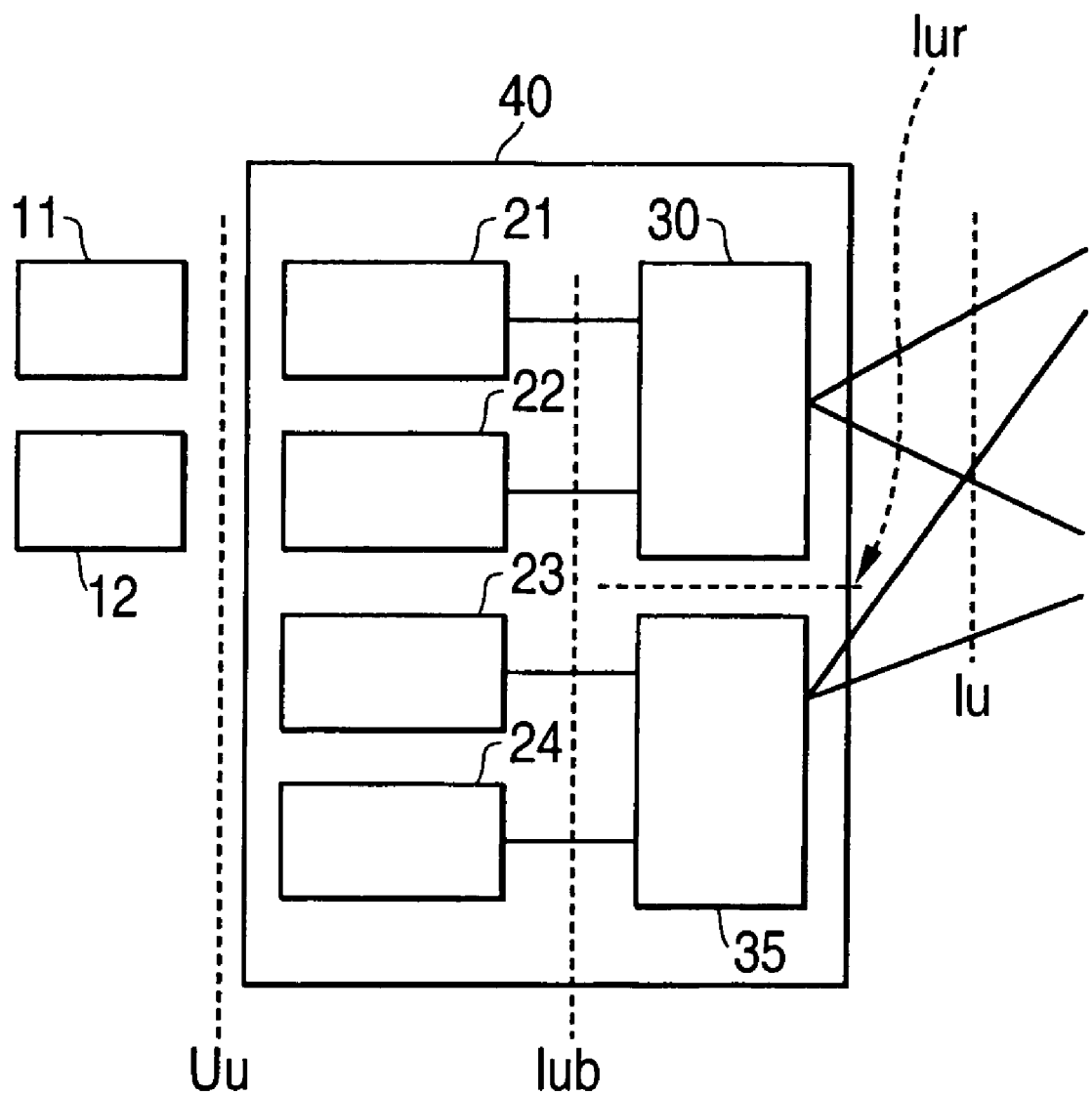
FIG. 4 is a block diagram of the architecture of an exemplary next generation cellular communication system in which the preferred embodiments may be practiced.

FIG. 4 is a block diagram of the architecture of an exemplary next generation cellular communication system in which the preferred embodiments may be practiced. First user equipment (UE) 11 and second UE 12 are connected via a Uu radio interface to respective first and second base stations 21, 22 of UTRAN 40. The base stations participate in radio resource signalling and management, and provide radio connections with UE 11 and 12 through transmitters. UTRAN 40 includes at least one base station controller 30 connected to the base station 21, 22 via a Iub interface and is responsible for the management and the control of the radio resources in its domain (i.e., the base station controllers 21, 22 connected to it). RNC 30 may be a service access point for all services the UTRAN 40 provides to a core network (not shown). FIG. 4 also shows a second RNC 35 connected to base stations 23 and 24 via the Iub interface. An Iur interface is provided between RNC 30 and RNC 35. For ease of illustration, only two base station controllers are shown in FIG. 4. There may, of course, be any number of base stations and base station controllers in the radio access network. Similarly, the transmitters of the base stations are also not shown.

The preferred application of the preferred embodiments of the invention is in the base station of a next generation multi-carrier cellular communication system. However, the preferred embodiments are not so limited in their application and may be implemented in the transmitter circuitry of a wide variety of devices.

Figure 5:
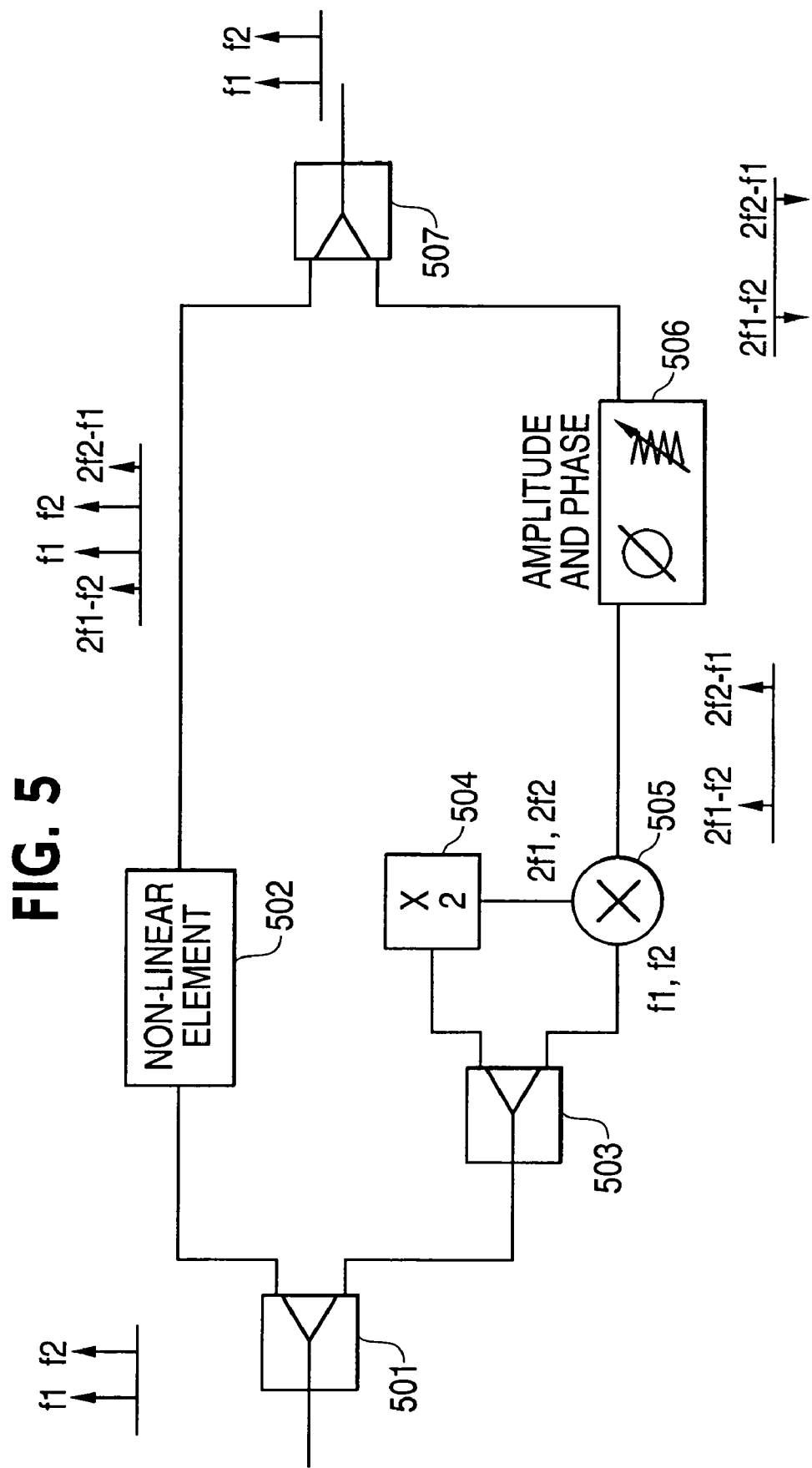
FIG. 5 illustrates an intermodulation product cancellation circuit according to an embodiment of the invention.

An amplifier circuit stage according to a preferred embodiment of the invention is shown in FIG. 5. The preferred embodiment can be applied to any stage in a transmitter chain. The input signal to the stage is at two fundamental frequencies, f1 and f2. It is split by a first signal splitter 501 into two branches.

The signal on the first main branch contains fundamental frequencies f1 and f2 of a primary carrier and is processed by at least one non-linear element 502. Non-linear element 502 may be a mixer, an amplifier or a combination of a mixer and amplifier. As explained above, the output of non-linear element 502 is a signal having third order intermodulation products as well as the original fundamental frequencies f1 and f2. The third order intermodulation products occur at the frequencies $2Zf_1-Zf_2$ and $2Zf_2-Zf_1$. Z is a variable conversion factor.

The second branch creates third order modulation products from a portion of the primary carrier. The input signal to the second branch from first signal splitter 501 contains fundamental frequencies f1 and f2 and is split by a second signal splitter 503 into first and second replicated signals containing fundamental frequencies f1 and f2. The fundamental frequencies in the first signal are doubled by doubling circuit 504 into a doubled signal having second harmonics 2f1 and 2f2. The doubling circuit can be, for example, a frequency multiplier or mixer.

The doubled signal from doubling circuit 504 is multiplied at multiplying circuit 505 by the second signal from second signal splitter 503 and the resulting signal has the third order intermodulation products at frequencies $2Zf_1-Zf_2$ and $2Zf_2-Zf_1$ (the conversion factor "Z" is not shown in the figure to simplify). Multiplying circuit 505 can use, for example, a multiplier or a mixer.

The generated products may then be adjusted in gain, amplitude, frequency and phase in adjustment circuit 506 such that the output signal cancels the inherent third order products in the signal from non-linear element 502. The adjustment circuit 506 depends upon non-linear element 502. If non-linear element 502 is an amplifier, then adjustment circuit 506 adjusts at least the amplitude and phase. If non-linear element 502 is a mixer or a combination of a mixer and an amplifier, then adjustment circuit 506 adjusts at least the frequency, amplitude and phase. It may consist simply of a mixer to adjust the frequency and an amplifier to correct the amplitude. In either embodiment, a gain adjuster may or may not be needed. The addition of a gain adjuster may be merely a design choice and may only be required if loss in the second path is such that additional gain would be required to achieve the amplitude desired.

The output signal of adjustment circuit 506 is combined with the signal from the first branch by signal combiner 507. The output signal of signal combiner 507 thus contains only the fundamental frequencies f1 and f2.

Figure 6A:
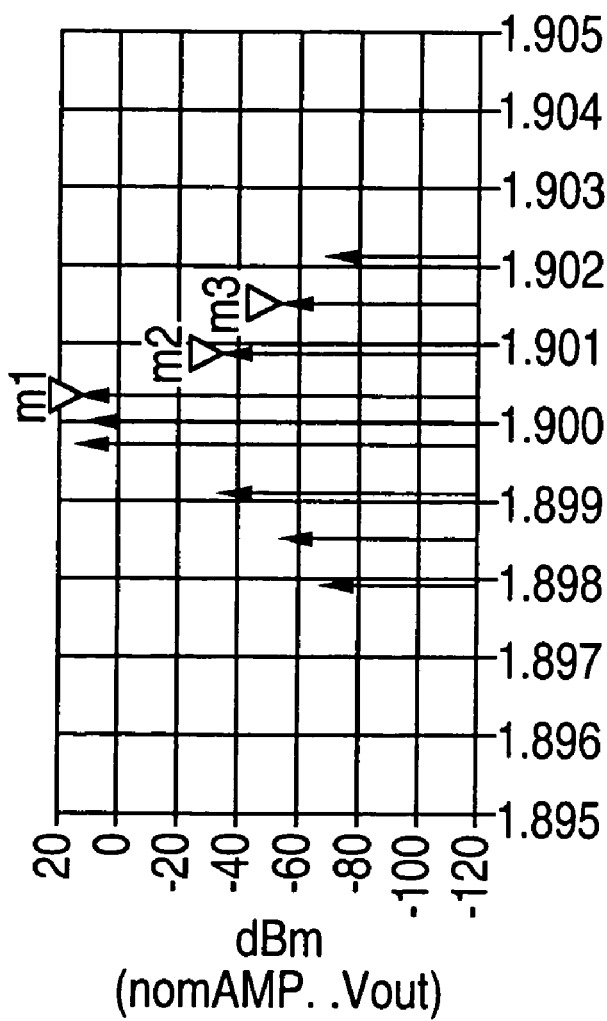
FIGS. 6A and 6B are comparisons of results for the intermodulation product cancellation circuit in FIG. 3.
Figure 6B:
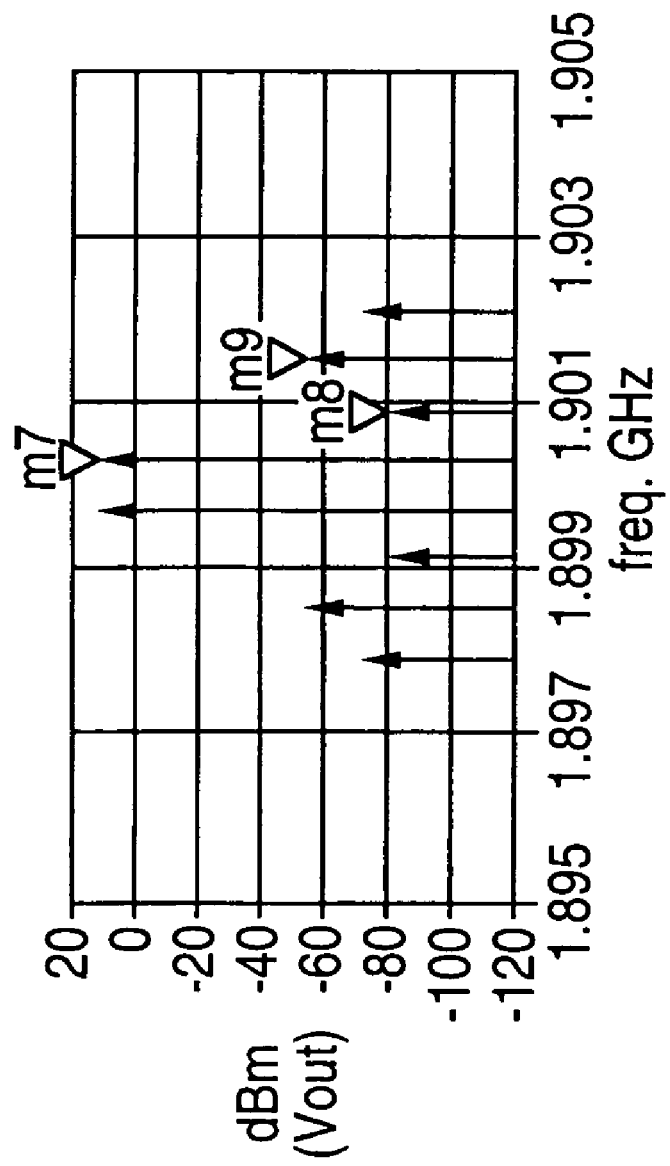

Preferably, the third order intermodulation products are suppressed sufficiently to meet the EDGE modulation requirements for RF driver amplifier stages at reduced power backoff. FIG. 6A shows the baseline simulation results obtained from an amplifier without any cancellation circuitry. FIG. 6B shows the simulated suppression results obtained from an amplifier containing the circuitry shown in FIG. 5. As shown, the left output IP3 is 36.208 and the right output IP3 is 36.204 for the baseline. With IM3 cancellation, the left output IP3 is 59.099 and the right output IP3 is 59.570.

FIG. 7 is a table containing the results of the cancellation circuitry as a function of the input fundamental frequency. It shows that the output is above 56.0 for the range of frequencies between 1880 MHz (1.880E9) and 1925 MHZ (1.925E9). In other words, the cancellation circuitry achieves a reasonable bandwidth (20 dB IP3/40 dB IM3 improvement over 45 MHz).

Although the circuitry in FIG. 5 targets the third order products, it can be adjusted to a modified version that removes the fifth order or some higher order products. The modification can be accomplished by either changing the mixer or changing doubling circuit 504 to a higher order frequency generator to obtain the higher order harmonics.

The cancellation circuitry has advantages over the prior art because it does not require two loops and does not involve large delay lines. With only one loop and without the delay line, the system can be made smaller and require less circuitry. In particular, large delay lines can be required for large bandwidths. With the absence of a delay line, it is possible for the circuit to be included as part of an integrated circuit in a single semiconductor chip. Alternatively, the circuit can be implemented on a printed circuit board (sometimes referred to as a printed wiring board) or as an integrated circuit on an advanced substrate such as a Low Temperature Co-Fired Ceramic (LTCC). See, for example, *Design Rules For Physical Layout of Low Temperature Co-Fired Ceramic Modules*, Revision 8.1, Jan. 5, 2000, by National Semiconductor, which is hereby incorporated by reference. An LTCC implementation can be used, for example, to minimize the coupler size if the couplers can not be placed on a semiconductor chip.

I claim:

1. A signal processing circuit comprising:
   a first branch comprising at least one non-linear element;
   a second branch;
   a first signal splitter, the first signal splitter splitting an input signal having a primary carrier with fundamental frequencies into first and second signals which are provided, respectively, to the first branch and the second branch, the first branch processing said first signal from said first signal splitter to produce a processed signal comprising a first set of intermodulation products,
   the second branch having a second signal splitter, a frequency doubler, a mixer and an adjustment circuit arranged to produce a control signal containing a second set of intermodulation products having approximately equivalent frequency, amplitude, and opposite phase with the first set of intermodulation products; and
   a coupler, the coupler combining the processed signal and the control signal.

2. A signal processing circuit according to claim 1, wherein said non-linear element comprises an amplifier.

3. A signal processing circuit according to claim 2, wherein the adjustment circuit includes an amplitude adjuster and a phase adjuster.

4. A signal processing circuit according to claim 2, wherein the adjustment circuit includes an amplitude adjuster, a phase adjuster, and a gain adjuster.

5. A signal processing circuit according to claim 1, wherein said non-linear element comprises a mixer.

6. A signal processing circuit according to claim 5, wherein the adjustment circuit comprises a frequency adjuster, a phase adjuster, and an amplitude adjuster.

7. A signal processing circuit according to claim 5, wherein the adjustment circuit includes a frequency adjuster, a phase adjuster, an amplitude adjuster and a gain adjuster.

8. A signal processing circuit according to claim 1, wherein the non-linear element comprises a mixer and an amplifier.

9. A signal processing circuit according to claim 8, wherein the adjustment circuit includes a frequency adjuster, a phase adjuster, and an amplitude adjuster.

10. A signal processing circuit according to claim 8, wherein the adjustment circuit includes a frequency adjuster, a phase adjuster, an amplitude adjuster, and a gain adjuster.

11. A base station in a wireless communication system, comprising:
    a transmitter, said transmitter communicating with at least one piece of user equipment; and
    a signal processing circuit, said amplifier circuit including:
    a first branch comprising at least one non-linear element;
    a second branch;
    a first signal splitter, the first signal splitter splitting an input signal having a primary carrier with fundamental frequencies into first and second signals which are provided, respectively, to the first branch and the second branch, the first branch processing said first signal from said first signal splitter,
    the second branch having a multiplying circuit arranged to multiply said second signal to produce a processed signal containing a first set of higher order intermodulation products, the second branch having a second signal splitter, a frequency doubler, a mixer and an adjustment circuit arranged to produce a control signal containing a second set of intermodulation products having approximately equivalent frequency, amplitude, and opposite phase the first set of intermodulation products; and
    a coupler, the coupler combining the processed signal and the control signal.

12. A base station according to claim 11, wherein said non-linear element comprises an amplifier.

13. A base station according to claim 12, wherein the adjustment circuit includes an amplitude adjuster and a phase adjuster.

14. A base station according to claim 12, wherein the adjustment circuit includes an amplitude adjuster, a phase adjuster, and a gain adjuster.

15. A base station according to claim 11, wherein said non-linear element comprises a mixer.

16. A base station according to claim 15, wherein said adjustment circuit comprises a frequency adjuster, a phase adjuster, and an amplitude adjuster.

17. A base station according to claim 15, wherein the adjustment circuit includes a frequency adjuster, a phase adjuster, an amplitude adjuster and a gain adjuster.

18. A base station according to claim 11, wherein the non-linear element comprises a mixer and an amplifier.

19. A base station according to claim 18, wherein the adjustment circuit includes a frequency adjuster, a phase adjuster, and an amplitude adjuster.

20. A base station according to claim 18, wherein the adjustment circuit includes a frequency adjuster, a phase adjuster, an amplitude adjuster, and a gain adjuster.

21. A method of cancelling intermodulation products in an input signal having a primary carrier with fundamental frequencies, comprising:
    splitting the input signal into first and second signals using a first signal splitter which are provided respectively, to first and second branches;
    processing the first signal in a non-linear element in the first branch to produce a processed signal comprising a first set of intermodulation products;
    arranging a second signal splitter, frequency doubler, a mixer and an adjustment circuit in said second branch to produce, from said second signal, a control signal containing a second set of higher order intermodulation products having approximately equivalent frequency, amplitude, and opposite phase with the first set of intermodulation products; and
    combining the processed signal and the control signal using a coupler.

22. A method according to claim 21, wherein said processing of said first signal in said first branch comprises amplifying said first signal.

* * * * *